(12) United States Patent
Cheng et al.

(10) Patent No.: US 8,969,155 B2
(45) Date of Patent: Mar. 3, 2015

(54) FIN STRUCTURE WITH VARYING ISOLATION THICKNESS

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, CA (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 13/891,212

(22) Filed: May 10, 2013

(65) Prior Publication Data

US 2014/0332861 A1    Nov. 13, 2014

(51) Int. Cl.
| | | |
|---|---|---|
| *H01L 21/336* | (2006.01) | |
| *H01L 29/66* | (2006.01) | |
| *H01L 21/306* | (2006.01) | |
| *H01L 29/78* | (2006.01) | |
| *H01L 27/088* | (2006.01) | |
| *H01L 27/108* | (2006.01) | |
| *H01L 27/12* | (2006.01) | |
| *H01L 21/8234* | (2006.01) | |
| *H01L 21/84* | (2006.01) | |
| *H01L 27/092* | (2006.01) | |

(52) U.S. Cl.
CPC ........ *H01L 29/66795* (2013.01); *H01L 21/306* (2013.01); *H01L 29/785* (2013.01); *H01L 27/0886* (2013.01); *H01L 27/10826* (2013.01); *H01L 27/10879* (2013.01); *H01L 27/1211* (2013.01); *H01L 21/823431* (2013.01); *H01L 21/845* (2013.01); *H01L 27/0924* (2013.01)
USPC ........... 438/268; 438/425; 438/595; 257/347; 257/349; 257/368; 257/401; 257/E29.255; 257/E21.618; 257/E21.628; 257/E21.654

(58) Field of Classification Search
CPC ............... H01L 21/823431; H01L 21/823821; H01L 21/845; H01L 27/0886; H01L 27/0924; H01L 29/10826; H01L 27/10879; H01L 21/1211; H01L 29/66795; H01L 29/785
USPC .......... 438/268, 297, 425, 595; 257/302, 347, 257/349, 350, 368, 401, E21.618, E21.628, 257/E21.654, E29.255
See application file for complete search history.

(56) References Cited

U.S. PATENT DOCUMENTS

| | | |
|---|---|---|
| 7,256,078 B2 * | 8/2007 | Anderson et al. ............. 438/157 |
| 7,300,837 B2 | 11/2007 | Chen et al. |
| 7,442,590 B2 | 10/2008 | Orlowski |
| 7,807,517 B2 | 10/2010 | Kim et al. |
| 7,898,040 B2 | 3/2011 | Nawaz |
| 7,923,337 B2 | 4/2011 | Chang |
| 7,977,174 B2 | 7/2011 | Luning et al. |
| 8,017,463 B2 | 9/2011 | Chang |
| 8,258,577 B2 | 9/2012 | Dixit |
| 8,766,363 B2 * | 7/2014 | Cheng et al. .................. 257/347 |

(Continued)

*Primary Examiner* — Joseph C Nicely
(74) *Attorney, Agent, or Firm* — Howard H. Cohn; H. Daniel Schnurmann

(57) ABSTRACT

Semiconductor fins having isolation regions of different thicknesses on the same integrated circuit are disclosed. Nitride spacers protect the lower portion of some fins, while other fins do not have spacers on the lower portion. The exposed lower portion of the fins are oxidized to provide isolation regions of different thicknesses.

18 Claims, 8 Drawing Sheets

(56) References Cited

U.S. PATENT DOCUMENTS

| | | | |
|---|---|---|---|
| 2013/0196478 A1* | 8/2013 | Chang et al. | 438/283 |
| 2013/0320294 A1* | 12/2013 | Cappellani et al. | 257/9 |
| 2014/0001560 A1* | 1/2014 | Cappellani et al. | 257/368 |
| 2014/0061862 A1* | 3/2014 | Vega et al. | 257/616 |
| 2014/0124860 A1* | 5/2014 | Cheng et al. | 257/347 |
| 2014/0124863 A1* | 5/2014 | Cheng et al. | 257/350 |
| 2014/0191323 A1* | 7/2014 | Bergendahl et al. | 257/368 |

* cited by examiner

FIN STRUCTURE WITH VARYING ISOLATION THICKNESS

FIELD OF THE INVENTION

The present invention relates generally to semiconductor fabrication, and more particularly to structures and methods for forming fin field effect transistors (FinFETs).

BACKGROUND OF THE INVENTION

With the continuing trend towards miniaturization of integrated circuits (ICs), there is a need for transistors to have higher drive currents with increasingly smaller dimensions. FinFET technology is becoming more prevalent as device size continues to shrink. Silicon-on-insulator (SOI) finFET devices have excellent electrical performance. However, the cost of manufacturing SOI finFETs can be high. Bulk fin-FETs, where there is no insulator film between the fins and the substrate, have a lower manufacturing cost as compared with a SOI finFET. However, bulk finFETs are prone to leakage currents which can degrade the electrical performance. It is therefore desirable to have improved methods and structures for implementation of finFET devices.

SUMMARY OF THE INVENTION

In one embodiment, a method of forming a semiconductor structure is provided. The method comprises depositing a first nitride layer on a semiconductor structure comprising a first fin and a second fin, removing a portion of the first nitride layer to form nitride spacer regions on a lower sidewall portion of the first fin and a lower sidewall portion of the second fin, removing the nitride spacer regions from the first fin, depositing an oxide region on the semiconductor structure, recessing the oxide region, depositing a second nitride layer over the semiconductor structure, removing a portion of the second nitride layer to form nitride spacer regions on an upper sidewall portion of the first fin and an upper sidewall portion of the second fin, forming an isolation region under the first fin by performing a thermal oxidation, and removing the nitride spacer regions from the upper sidewall portion of the first fin and the upper sidewall portion of the second fin.

In another embodiment, a method of forming a semiconductor structure is provided. This method comprises depositing a first nitride layer on a semiconductor structure comprising a first fin and a second fin, removing a portion of the first nitride layer to form nitride spacer regions on a lower sidewall portion of the first fin and a lower sidewall portion of the second fin, removing the nitride spacer regions from the first fin, depositing a first oxide region on the semiconductor structure, recessing the first oxide region to a level below the top of the first fin and second fin, and above the nitride spacer regions on the lower sidewall portion of the second fin, depositing a second nitride layer over the semiconductor structure, removing a portion of the second nitride layer to form nitride spacer regions on an upper sidewall portion of the first fin and an upper sidewall portion of the second fin, depositing a second oxide region on the semiconductor structure, forming an isolation region under the first fin and under the second fin by performing a thermal oxidation, removing the second oxide region from the semiconductor structure, and removing the nitride spacer regions from the upper sidewall portion of the first fin and the upper sidewall portion of the second fin.

In another embodiment, a semiconductor structure is provided. The semiconductor structure comprises a semiconductor substrate, a first fin formed in the semiconductor substrate, a second fin formed in the semiconductor substrate, wherein a first oxide region is disposed below the first fin, and wherein a second oxide region is disposed below the second fin, and wherein the first oxide region is thicker than the second oxide region.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
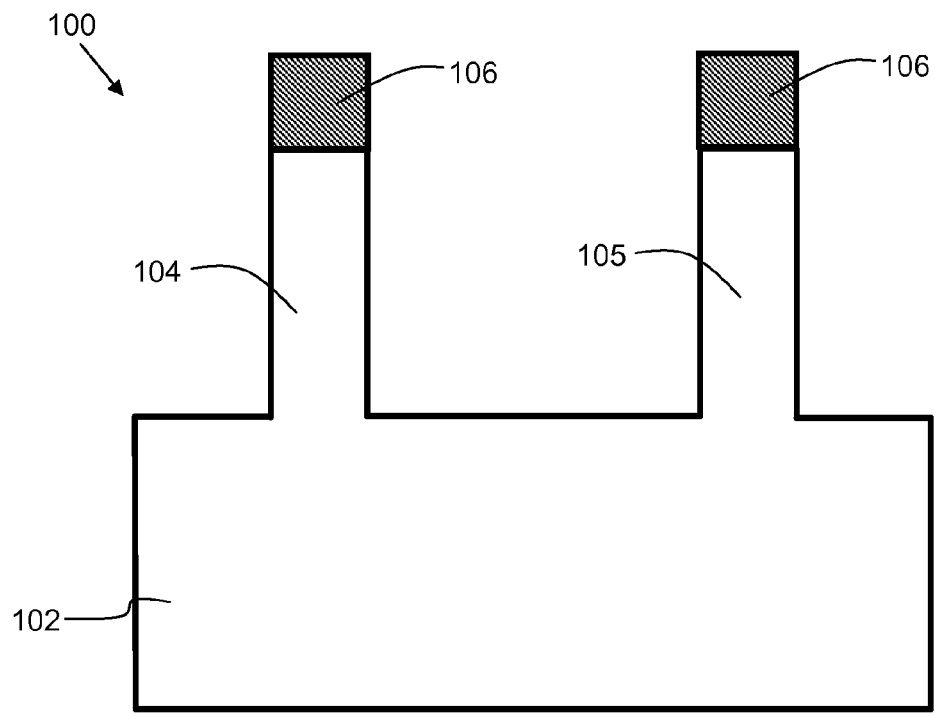

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for embodiments of the present invention.

Figure 2:
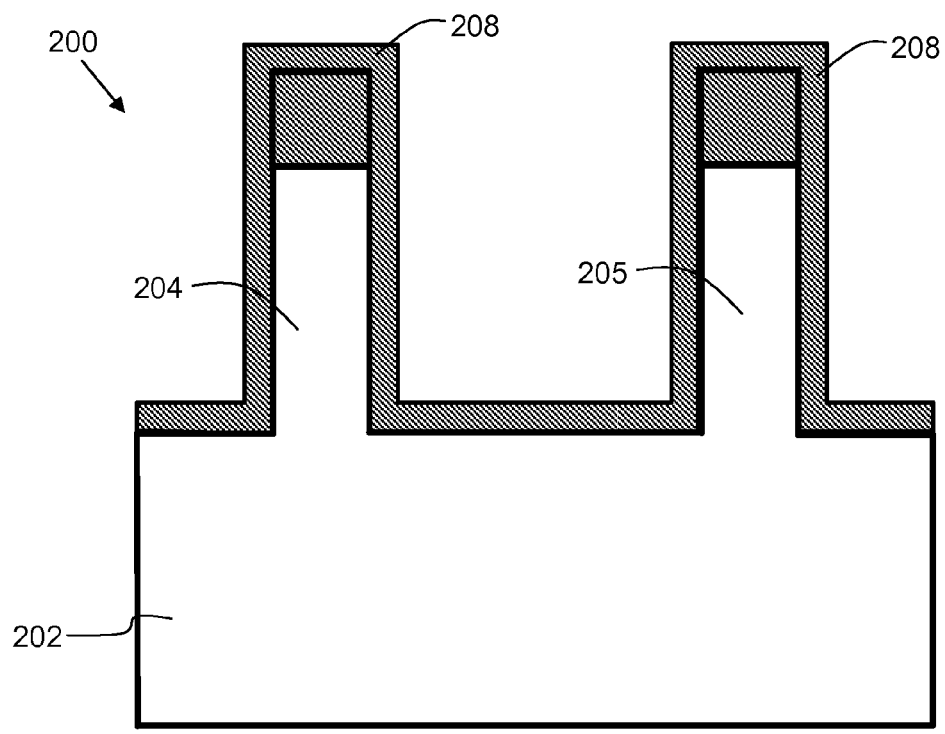

FIG. 2 shows a semiconductor structure after a subsequent process step of depositing a first nitride layer.

Figure 3:
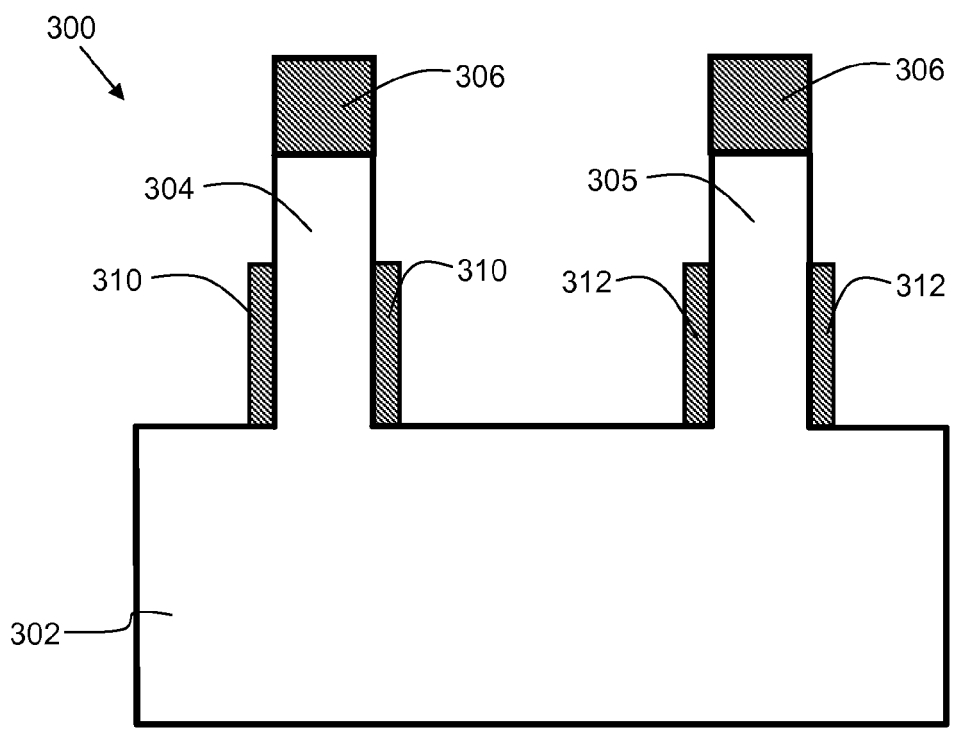

FIG. 3 shows a semiconductor structure after a subsequent process step of removing a portion of the first nitride layer.

Figure 4:
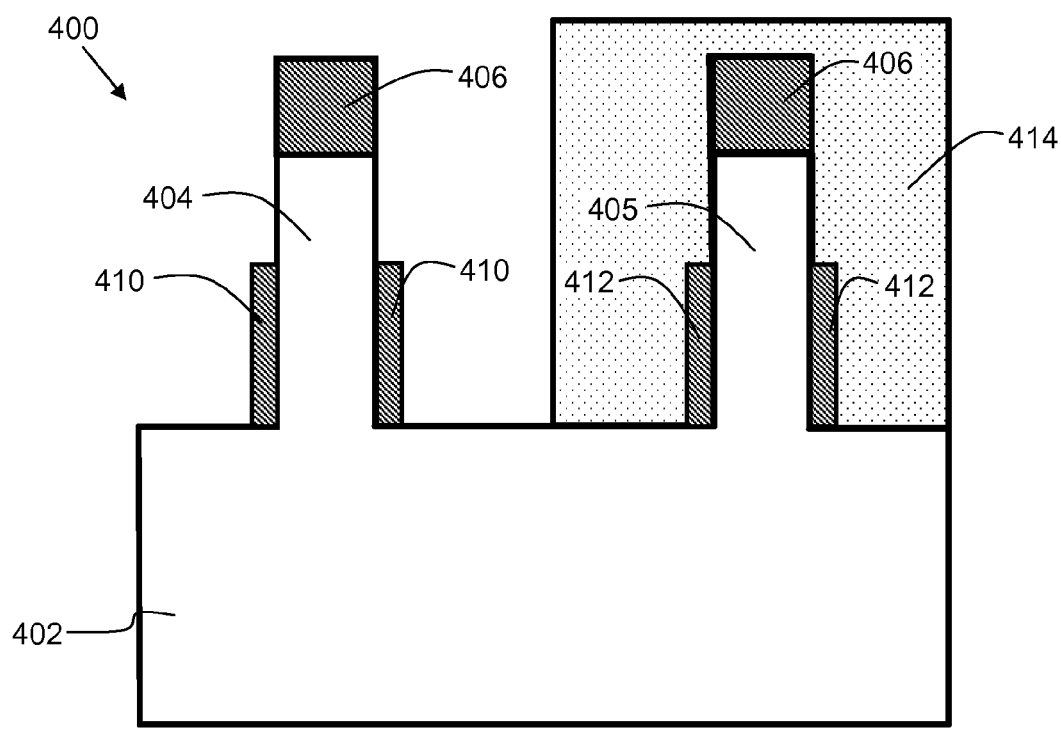

FIG. 4 shows a semiconductor structure after a subsequent process step of applying a mask region to the second fin.

Figure 5:
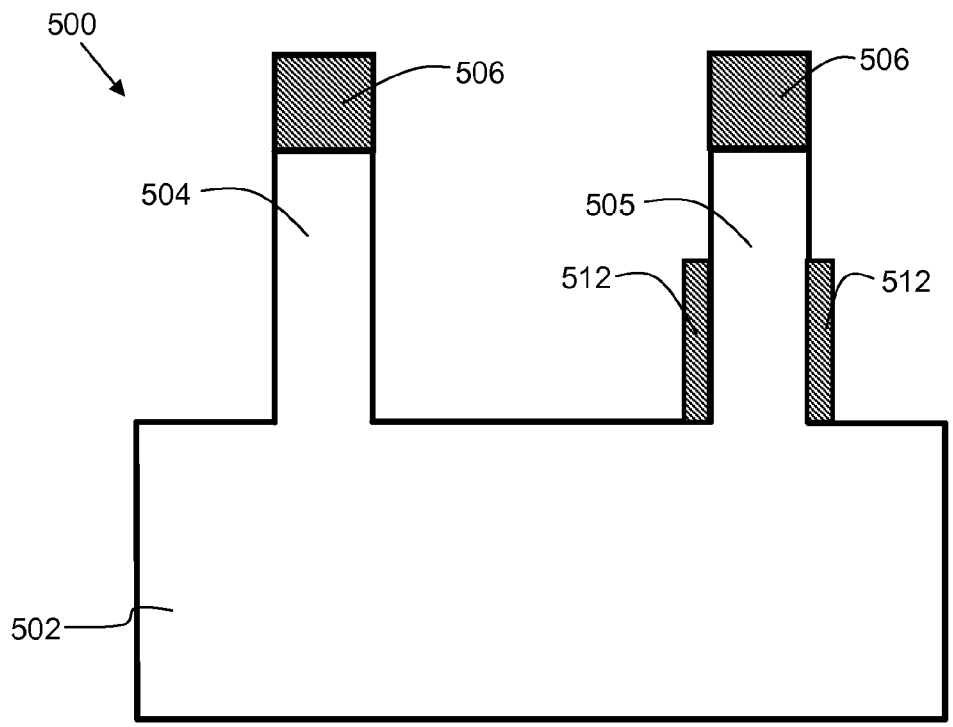

FIG. 5 shows a semiconductor structure after a subsequent process step of removing the spacers from the first fin.

Figure 6:
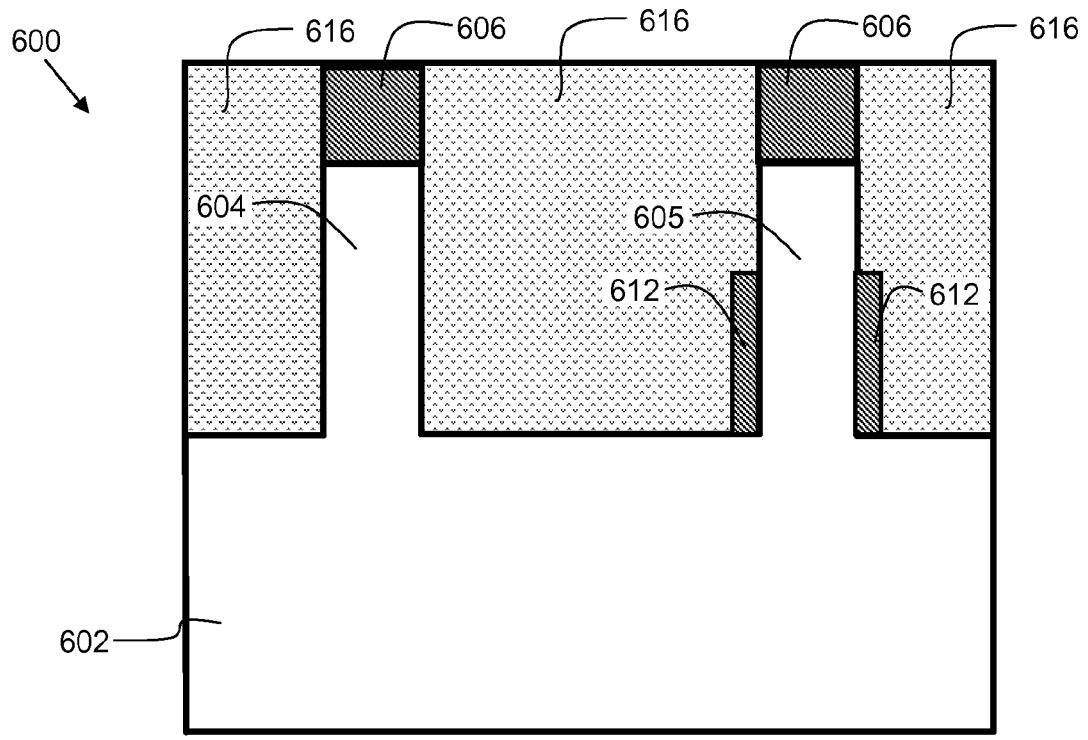

FIG. 6 shows a semiconductor structure after a subsequent process step of depositing an oxide layer.

Figure 7:
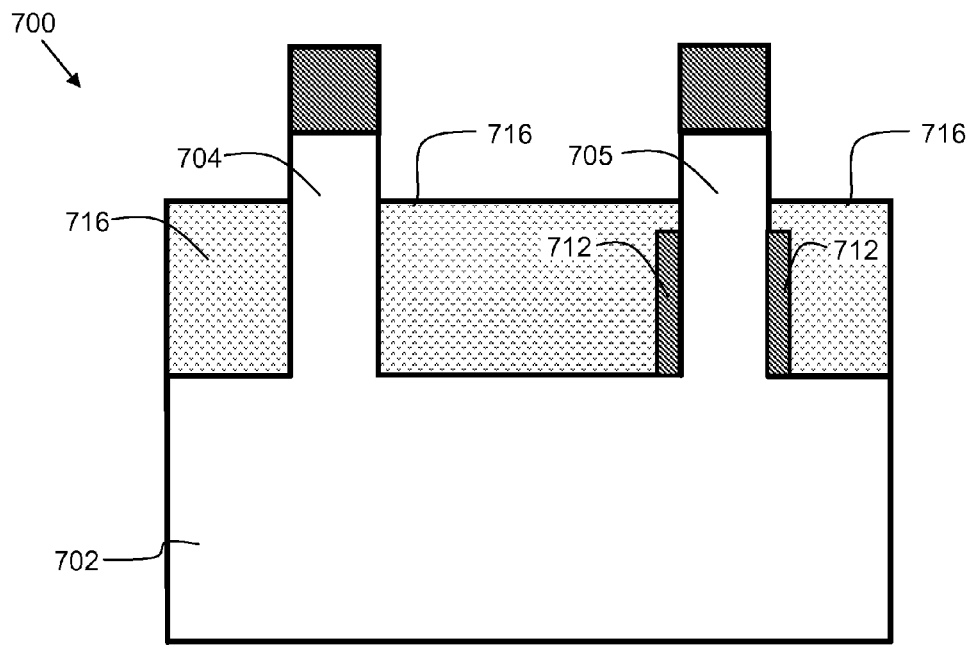

FIG. 7 shows a semiconductor structure after a subsequent process step of recessing the oxide layer.

Figure 8:
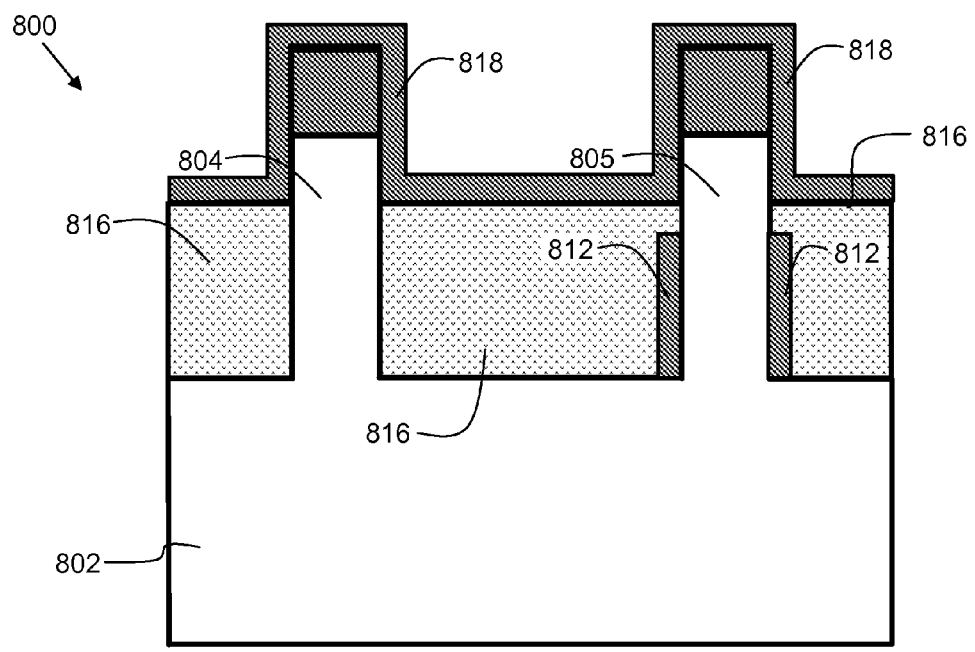

FIG. 8 shows a semiconductor structure after a subsequent process step of depositing a second nitride layer.

Figure 9:
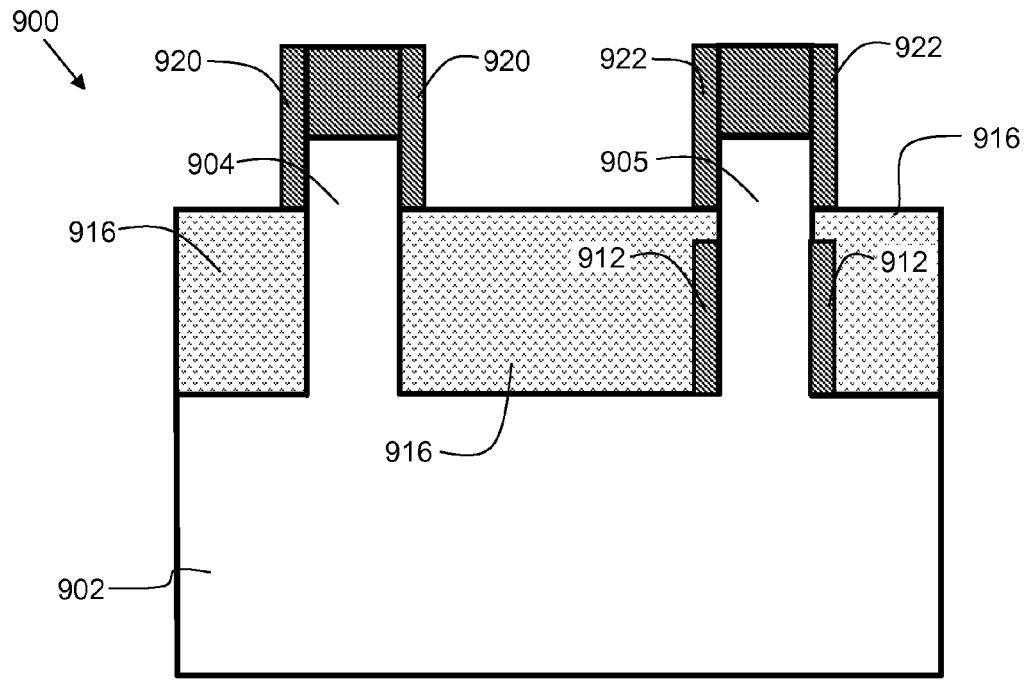

FIG. 9 shows a semiconductor structure after a subsequent process step of removing a portion of the second nitride layer.

Figure 10:
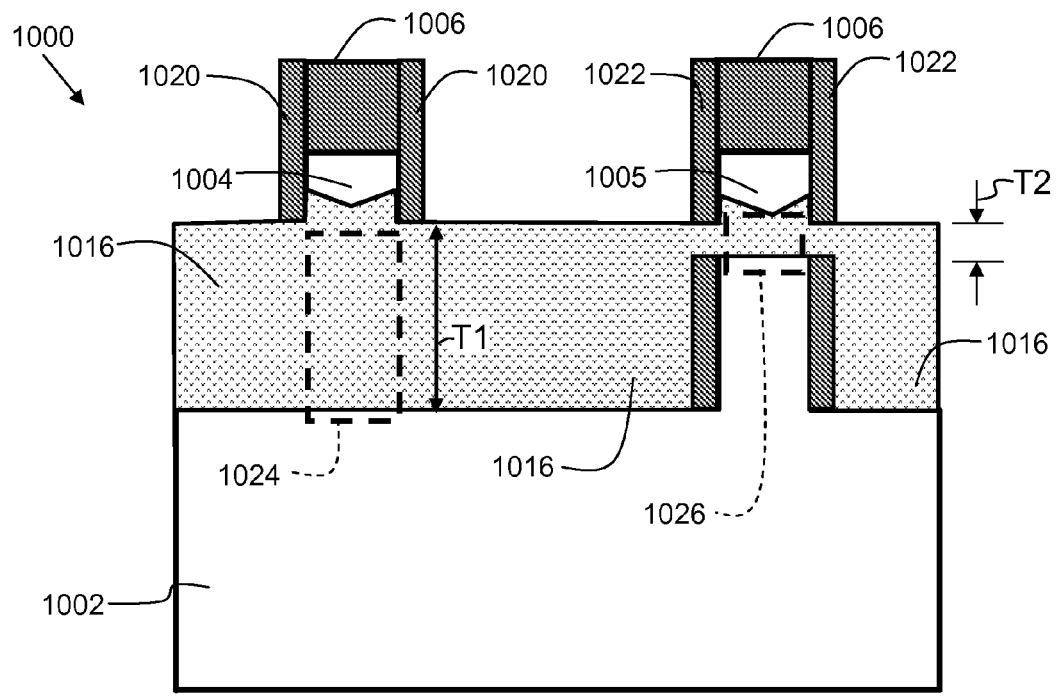

FIG. 10 shows a semiconductor structure after a subsequent process step of performing an oxidation.

Figure 11:
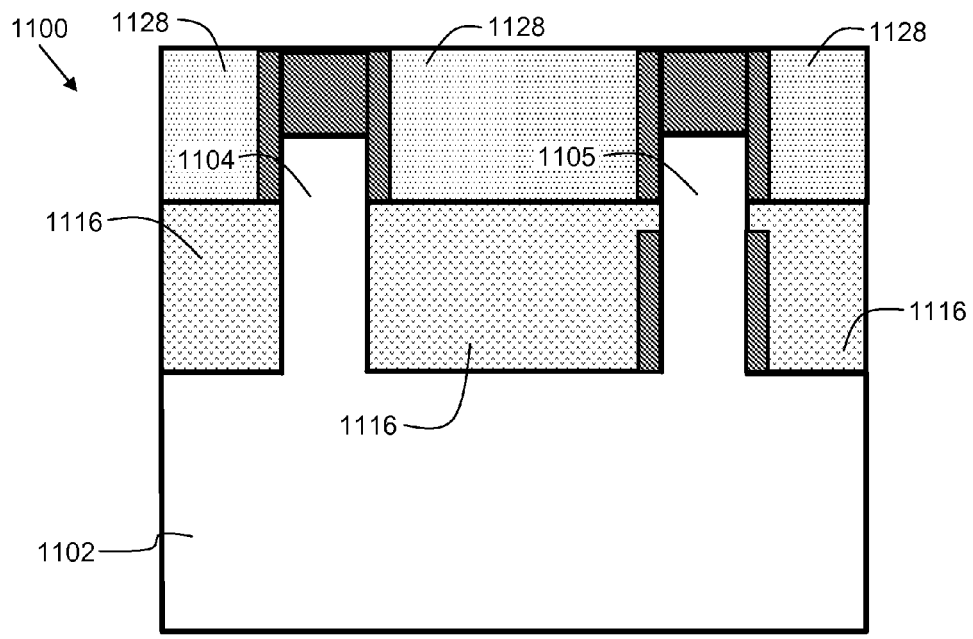

FIG. 11 shows a semiconductor structure of an alternative embodiment after a subsequent process step of depositing a stabilizing oxide layer.

Figure 12:
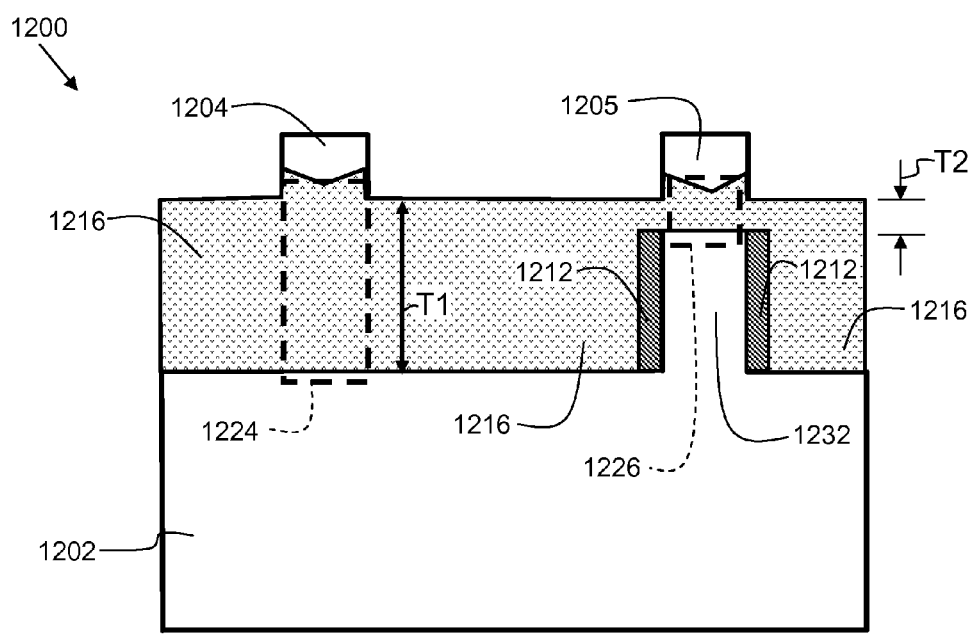

FIG. 12 shows a semiconductor structure in accordance with embodiments of the present invention.

Figure 13:
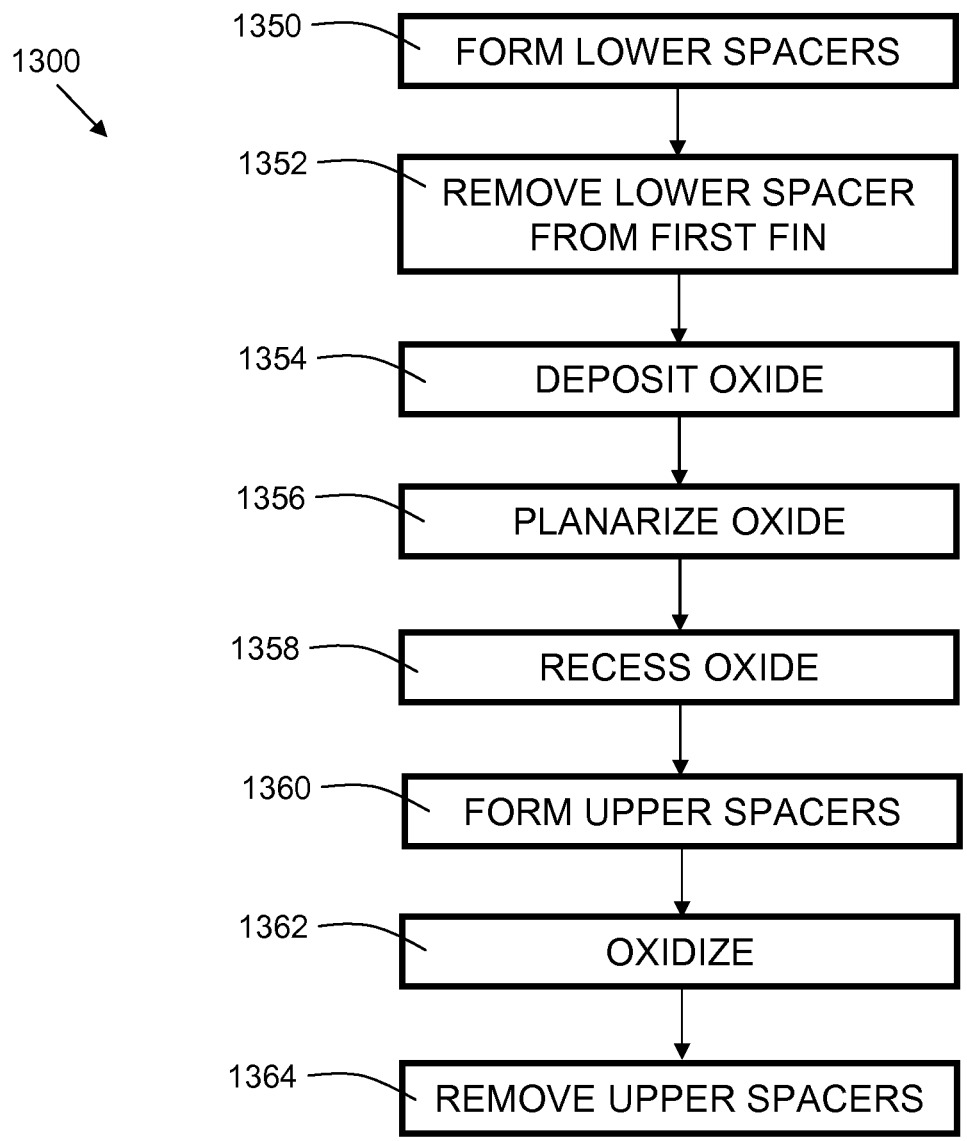

FIG. 13 is a flowchart indicating process steps for embodiments of the present invention.

Figure 14:
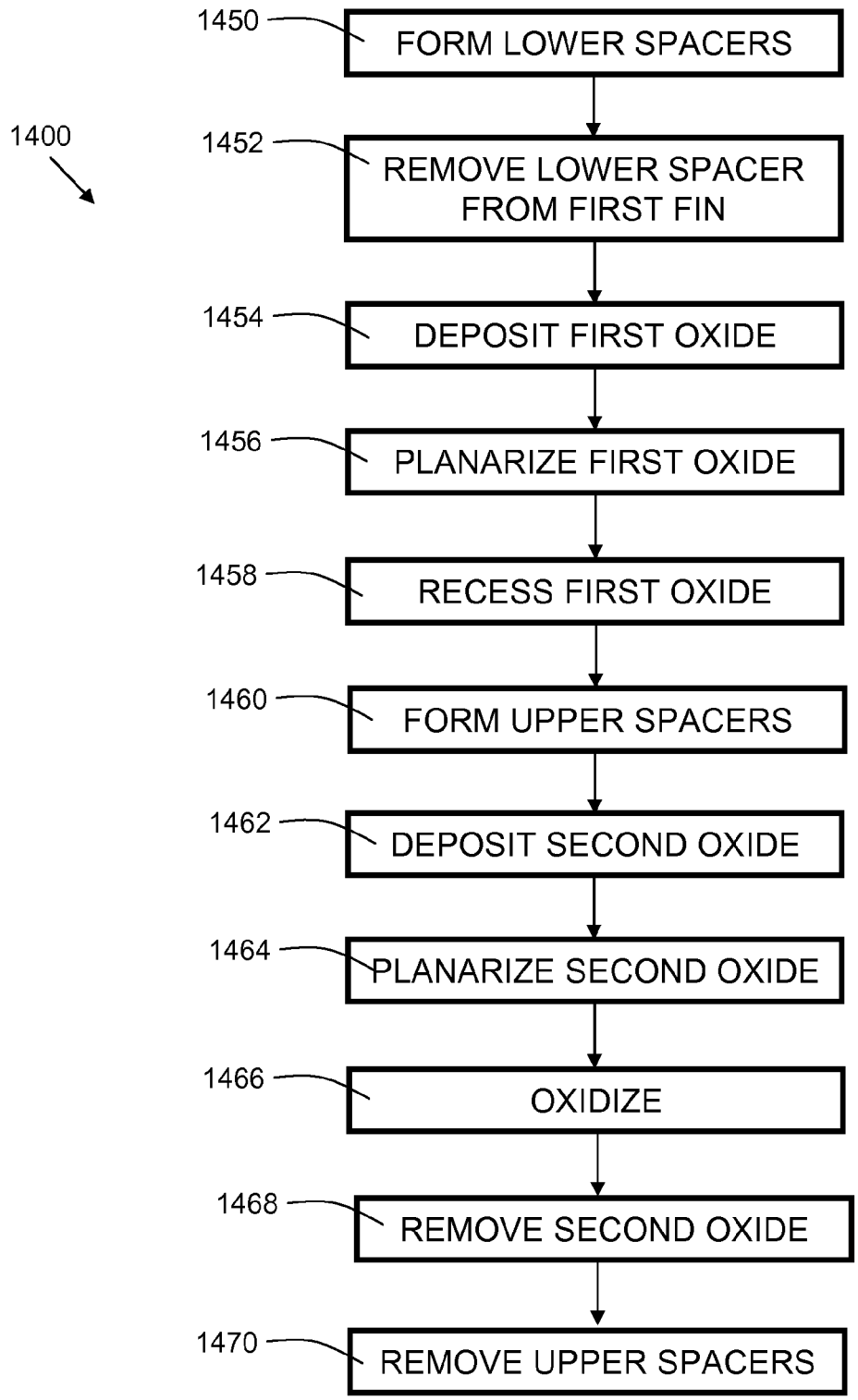

FIG. 14 is a flowchart indicating process steps for alternative embodiments of the present invention.

DETAILED DESCRIPTION

Embodiments of the present invention provide structures for semiconductor fins having isolation regions of different thicknesses on the same integrated circuit. Fins isolated from the substrate with relatively thin dielectric between the fin and the substrate are considered attractive as they allow isolation underneath the channel while providing a means to form embedded stressors by recessing the fin and oxide and growing an epitaxial stressor region using the substrate as the seed layer. However, for some circuit elements, such as for some DRAM devices, it is preferred to have thick dielectric isolation. Therefore, there is a need to integrate thin and thick dielectric isolation on the same wafer.

FIG. 1 is a semiconductor structure 100 at a starting point for embodiments of the present invention. A bulk semiconductor substrate 102 forms the base of semiconductor structure 100. Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, a first fin 104 and a second fin 105 are formed in the bulk substrate 102. Fins 104 and 105 are semiconductor fins. A pad nitride layer 106 is disposed on top of fin 104 and fin 105. The pad nitride layer 106 may be blanket deposited on the structure prior to fin formation. Note that for the sake of illustrative simplicity, only two fins 104 and 105 are shown. However, in practice, there may be multiple fins formed on substrate 102. In the description that follows, there is different processing for the two fins at certain phases of the fabrication process. Those skilled in the art will recognize that in practice, there may be multiple fins, where the fins are divided into different groups which may receive the different processing at certain phases of the fabrication process.

FIG. 2 shows a semiconductor structure 200 after a subsequent process step of depositing a first nitride layer 208. Nitride layer 208 is a substantially conformal nitride layer. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. In some embodiments, the nitride layer is a silicon nitride layer 208 deposited via a chemical vapor deposition (CVD) process. In some embodiments, nitride layer 208 may have a thickness ranging from about 3 nanometers to about 10 nanometers.

FIG. 3 shows a semiconductor structure 300 after a subsequent process step of removing a portion of the first nitride layer, to form spacers 310 on a lower sidewall portion of first fin 304, and spacers 312 on a lower sidewall portion of second fin 305. In some embodiments, the portion of the nitride layer is removed by an anisotropic etch, such as a reactive ion etch (RIE) process. Preferably, the etch process has some selectivity to the material of substrate 302 (e.g. silicon).

FIG. 4 shows a semiconductor structure 400 after a subsequent process step of applying a mask region 414 to the second fin 405. The mask region 414 may be formed by industry-standard lithographic processes and patterning techniques. In some embodiments, mask region 414 may be comprised of photoresist. In other embodiments, mask region 414 may be comprised of a hard mask, such as an oxide hard mask. In yet other embodiments, a combination of a photoresist and hard mask may be used. Mask region 414 serves to protect second fin 405 while additional processing is applied to first fin 404. The additional processing includes removal of the spacers 410 from the first fin 404.

FIG. 5 shows a semiconductor structure 500 after a subsequent process step of removing the spacers (compare with 410 of FIG. 4) from the first fin 504, and removal of the mask region (compare with 414 of FIG. 4). The spacers may be removed via a reactive ion etch process.

FIG. 6 shows a semiconductor structure 600 after a subsequent process step of depositing an oxide layer 616. In some embodiments, a chemical vapor deposition process is used to deposit oxide layer 616. After the oxide layer 616 is deposited, it is planarized to be flush with the top of the pad nitride layer 606. In embodiments, the planarization is performed with a chemical mechanical polish (CMP) process.

FIG. 7 shows a semiconductor structure 700 after a subsequent process step of recessing the oxide layer. In some embodiments, the recessing of the oxide layer may be performed with a hydrofluoric acid (HF) etch process. In some other embodiments, the recessing of the oxide layer may be performed with a RIE process. The oxide region 716 is recessed to a level that is below the top of the first fin 704 and second fin 705, and above the nitride spacer regions 712 on the lower sidewall portion of the second fin 705.

FIG. 8 shows a semiconductor structure 800 after a subsequent process step of depositing a second nitride layer 818. Nitride layer 818 is a conformal nitride layer. In some embodiments, depositing nitride layer 818 is performed via a chemical vapor deposition (CVD) process. In some embodiments, nitride layer 818 may have a thickness ranging from about 3 nanometers to about 10 nanometers.

FIG. 9 shows a semiconductor structure 900 after a subsequent process step of removing a portion of the second nitride layer to form nitride spacer regions 920 on an upper sidewall portion of the first fin 904 and to form nitride spacer regions 922 on an upper sidewall portion of the second fin 905. In some embodiments, the portion of the nitride layer is removed by an anisotropic etch, such as a reactive ion etch (RIE) process. Preferably, the etch process has some selectivity to the material of substrate 902 (e.g. silicon) and the oxide 916.

FIG. 10 shows a semiconductor structure 1000 after a subsequent process step of performing an oxidation. In some embodiments, the oxidation is a thermal oxidation. The oxidation may be performed at a temperature ranging from about 900 degrees Celsius to about 1300 degrees Celsius. As a result of the oxidation process, lower portions of the semiconductor fins 1004 and 1005 that are not covered with nitride are converted to oxide, thus forming isolation regions disposed below fin 1004 and fin 1005, providing isolation from bulk substrate 1002. A first oxide region 1024 is formed directly below, and in direct physical contact with, the first fin 1004, and has a thickness T1. A second oxide region 1026 is formed directly below, and in direct physical contact with, the second fin 1005, and has a thickness T2. Oxide region 1024 and oxide region 1026 have a "V-shaped" or "tail" profile, in which the oxide regions are higher near the exterior of the fin, and lower near the interior of the fin. In some embodiments, the first oxide region 1024 is about four to five times thicker than the second oxide region 1026. Hence, in some embodiments, T1 is about four to five times greater than T2. In some embodiments, the first oxide region 1024 has a thickness T1 ranging from about 50 nanometers to about 200 nanometers, and the second oxide region 1026 has a thickness T2 ranging from about 10 nanometers to about 50 nanometers.

In some applications, such as various trench embedded DRAM circuits, it may be desirable to have a thicker isolation region below the fin, for the purposes of preventing leakage currents between the trench electrode and the substrate. In other cases, a thinner isolation region can be advantageous. For example, in some cases, it is desired to utilize an epitaxial stressor region (e.g. such as embedded SiGe) to apply a stress to a transistor channel to enhance carrier mobility. Having a thinner isolation region is helpful in this case, because it reduces the amount of etching needed to reach the semiconductor substrate material, and limits the height requirement of the epitaxial stressor region. If an epitaxial stressor region is grown too high, it could be prone to defects. Hence, embodiments of the present invention provide the advantages of fins with thick isolation and fins with thin isolation on the same integrated circuit (IC).

FIG. 11 shows a semiconductor structure 1100 of an alternative embodiment after a subsequent process step of depositing a second oxide layer 1128. Second oxide layer 1128 may be deposited via chemical vapor deposition (CVD), or other suitable process. In some embodiments, the second oxide layer 1128 may be comprised of the same material is first oxide layer 1116. In other embodiments, the second oxide layer 1128 may be of a different material than first oxide layer 1116, to achieve some selectivity in a subsequent recess etch process. After deposition, second oxide layer 1128 may be planarized. The planarization may be performed via a chemical mechanical polish (CMP) process, or other suitable process. The second oxide layer 1128 serves as a stabilizing oxide layer to prevent shifting of the fins 1104 and 1105 during the oxidation process, as the thermal oxidation may cause the fins to shift or tilt, due to the fact that when a silicon layer is oxidized it volume almost doubles. Hence, this embodiment prevents such a shift by using the second oxide layer 1128 as a stabilizing layer for the fins. The oxidation may be performed at a temperature ranging from about 900 degrees Celsius to about 1300 degrees Celsius. After the oxidation process, the second oxide layer 1128 is removed, and thus, the structure is then similar to structure 1000 shown in FIG. 10.

FIG. 12 shows a semiconductor structure 1200 in accordance with embodiments of the present invention. The upper spacers and pad nitride layer are removed (compare 1006, 1020, and 1022 of FIG. 10). The upper spacers and pad nitride layer may be removed via a reactive ion etch process. Isolation region 1224, formed by an oxidation process, is disposed below fin 1204. Isolation region 1226, formed by an oxidation process, is disposed below fin 1205. The isolation region 1224 is of a first thickness T1, and the isolation region 1226 is of a second thickness T2, where thickness T1 is not equal to thickness T2. The isolation regions 1224 and 1226 isolate the fins from the bulk substrate 1202. Fin portion 1232 is disposed below the second oxide region 1226. The fin portion 1232 is in direct physical contact with the semiconductor substrate 1202. Nitride spacers 1212 are disposed adjacent to the fin portion 1232. From this point forward, conventional techniques may be used to form fin field effect transistors (finFETs), and may include steps such as gate formation, gate spacer formation, stressor region formation, among others.

FIG. 13 is a flowchart 1300 indicating process steps for embodiments of the present invention. In process step 1350, lower spacers are formed (see 310 and 312 of FIG. 3). In process step 1352, the lower spacers are removed from the first fin (see 504 of FIG. 5). In process step 1354, an oxide layer is deposited (see 616 of FIG. 6). In process step 1356, the oxide is planarized. In process step 1358, the oxide is recessed (see 716 of FIG. 7). In process step 1360, upper spacers are formed (see 920 and 922 of FIG. 9). In process step 1362, an oxidation process is performed (see 1000 of FIG. 10). In process step 1364, the upper spacers are removed (see 1200 of FIG. 12).

FIG. 14 is a flowchart 1400 indicating process steps for alternative embodiments of the present invention. In process step 1450, lower spacers are formed (see 310 and 312 of FIG. 3). In process step 1452, the lower spacers are removed from the first fin (see 504 of FIG. 5). In process step 1454, an oxide layer is deposited (see 616 of FIG. 6). In process step 1456, the oxide is planarized. In process step 1458, the oxide is recessed (see 716 of FIG. 7). In process step 1460, upper spacers are formed (see 920 and 922 of FIG. 9). In process step 1462, a second oxide is deposited (see 1128 of FIG. 11). In process step 1464, the second oxide is planarized. In process step 1466, an oxidation process is performed. In process step 1468, the second oxide is removed, and the structure is then similar to structure 1000 of FIG. 10. In process step 1470, the upper spacers are removed (see 1200 of FIG. 12).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure comprising:
    depositing a first nitride layer on a semiconductor structure comprising a first fin and a second fin;
    removing a portion of the first nitride layer to form nitride spacer regions on a lower sidewall portion of the first fin and a lower sidewall portion of the second fin;
    removing the nitride spacer regions from the first fin;
    depositing an oxide region on the semiconductor structure;
    recessing the oxide region;
    depositing a second nitride layer over the semiconductor structure;
    removing a portion of the second nitride layer to form nitride spacer regions on an upper sidewall portion of the first fin and an upper sidewall portion of the second fin;
    forming an isolation region under the first fin by performing a thermal oxidation; and
    removing the nitride spacer regions from the upper sidewall portion of the first fin and the upper sidewall portion of the second fin.

2. The method of claim 1, further comprising planarizing the oxide region prior to recessing the oxide region.

3. The method of claim 2, wherein planarizing the oxide region is performed via a chemical mechanical polish process.

4. The method of claim 1, wherein depositing a first nitride layer is performed via a chemical vapor deposition process.

5. The method of claim 4, wherein depositing a first nitride layer comprises depositing a nitride layer having a thickness ranging from about 3 nanometers to about 10 nanometers.

6. The method of claim 1, wherein recessing the oxide region comprises recessing the oxide region to a level below the top of the first fin and second fin, and above the nitride spacer regions on the lower sidewall portion of the second fin.

7. The method of claim 1, wherein removing a portion of the first nitride layer is performed by a reactive ion etch process.

8. The method of claim 1, wherein performing a thermal oxidation comprises performing a thermal oxidation at a temperature ranging from about 900 degrees Celsius to about 1300 degrees Celsius.

9. The method of claim 1, further comprising depositing a mask region on the second fin prior to removing the nitride spacer regions from the first fin.

10. The method of claim 9, wherein depositing a mask region comprises depositing photoresist.

11. The method of claim 9, wherein depositing a mask region comprises depositing an oxide hard mask.

12. A method of forming a semiconductor structure comprising:
depositing a first nitride layer on a semiconductor structure comprising a first fin and a second fin;
removing a portion of the first nitride layer to form nitride spacer regions on a lower sidewall portion of the first fin and a lower sidewall portion of the second fin;
removing the nitride spacer regions from the first fin;
depositing a first oxide region on the semiconductor structure;
recessing the first oxide region to a level below the top of the first fin and second fin, and above the nitride spacer regions on the lower sidewall portion of the second fin;
depositing a second nitride layer over the semiconductor structure;
removing a portion of the second nitride layer to form nitride spacer regions on an upper sidewall portion of the first fin and an upper sidewall portion of the second fin;
depositing a second oxide region on the semiconductor structure;
forming an isolation region under the first fin and under the second fin by performing a thermal oxidation;
removing the second oxide region from the semiconductor structure; and
removing the nitride spacer regions from the upper sidewall portion of the first fin and the upper sidewall portion of the second fin.

13. The method of claim 12, wherein removing a portion of the first nitride layer is performed by a reactive ion etch process.

14. The method of claim 12, wherein performing a thermal oxidation comprises performing a thermal oxidation at a temperature ranging from about 900 degrees Celsius to about 1300 degrees Celsius.

15. The method of claim 12, further comprising depositing a mask region on the second fin prior to removing the nitride spacer regions from the first fin.

16. A semiconductor structure, comprising:
a semiconductor substrate;
a first fin formed in the semiconductor substrate;
a second fin formed in the semiconductor substrate;
wherein a first oxide region is disposed below the first fin; and
wherein a second oxide region is disposed below the second fin; and
wherein the first oxide region is thicker than the second oxide region;
a fin portion disposed below the second oxide region, wherein the fin portion is in direct physical contact with the semiconductor substrate;
nitride spacers disposed adjacent to the fin portion.

17. The semiconductor structure of claim 16, wherein the first oxide region is about four to five times thicker than the second oxide region.

18. The semiconductor structure of claim 16, wherein the first oxide region has a thickness ranging from about 50 nanometers to about 200 nanometers, and wherein the second oxide region has a thickness ranging from about 10 nanometers to about 50 nanometers.

* * * * *